United States Patent
Plevridis et al.

(10) Patent No.: US 8,143,965 B2
(45) Date of Patent: *Mar. 27, 2012

(54) ENHANCED POLAR MODULATOR FOR TRANSMITTER

(75) Inventors: Sofoklis Plevridis, Glyfada (GR);
Theodoros Georgantas, Haidari (GR);
Konstantinos D. Vavelidis, Ilioupoli (GR)

(73) Assignee: Broadcom Corporation, Irvine, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 12/828,838

(22) Filed: Jul. 1, 2010

(65) Prior Publication Data
US 2010/0271089 A1    Oct. 28, 2010

Related U.S. Application Data

(63) Continuation of application No. 12/115,068, filed on May 5, 2008, now Pat. No. 7,750,750.

(60) Provisional application No. 61/042,599, filed on Apr. 4, 2008.

(51) Int. Cl.
*H03C 3/00* (2006.01)

(52) U.S. Cl. ........ 332/119; 332/120; 332/127; 332/128; 332/144; 332/145

(58) Field of Classification Search .................. 332/119, 332/120, 128, 144, 145; 331/16; 375/376
See application file for complete search history.

(56) References Cited

U.S. PATENT DOCUMENTS

| | | | | |
|---|---|---|---|---|
| 6,960,947 | B2 * | 11/2005 | Albasini et al. | 327/147 |
| 7,157,985 | B2 * | 1/2007 | Mitani et al. | 332/119 |
| 7,522,011 | B2 * | 4/2009 | Matero et al. | 332/128 |
| 2005/0232385 | A1 * | 10/2005 | Yoshikawa et al. | 375/376 |
| 2006/0202774 | A1 * | 9/2006 | Hirano | 332/144 |

* cited by examiner

*Primary Examiner* — Joseph Chang
*Assistant Examiner* — Jeffrey Shin
(74) *Attorney, Agent, or Firm* — Garlick & Markison; Shayne X. Short

(57) ABSTRACT

Enhanced polar modulator for transmitter. Within a phase locked loop (PLL), a two point modulation topology is employed in which phase information passes through a limiter (e.g., a ±90° or ±π/2) in which the phase information dynamic range is divide by a factor (e.g., by 2) and a maximum frequency deviation is also divided by a factor (e.g., by 2). Then, a double balanced up-converter mixer/modulator is implemented to perform gain adjustment (e.g., magnitude and/or amplitude adjustment) and phase changes of 0° and +180° or 0 and +π (e.g., negative gains values may be employed). Phase adjustment in such an architecture is split and provided to both the PLL and to the mixer/modulator of such a polar modulator within a transmitter module such as may be implemented within a communication device (e.g., which may be a wireless communication device). This architecture that includes a PLL with a double balanced up-converter mixer/modulator suppresses even harmonics.

20 Claims, 5 Drawing Sheets

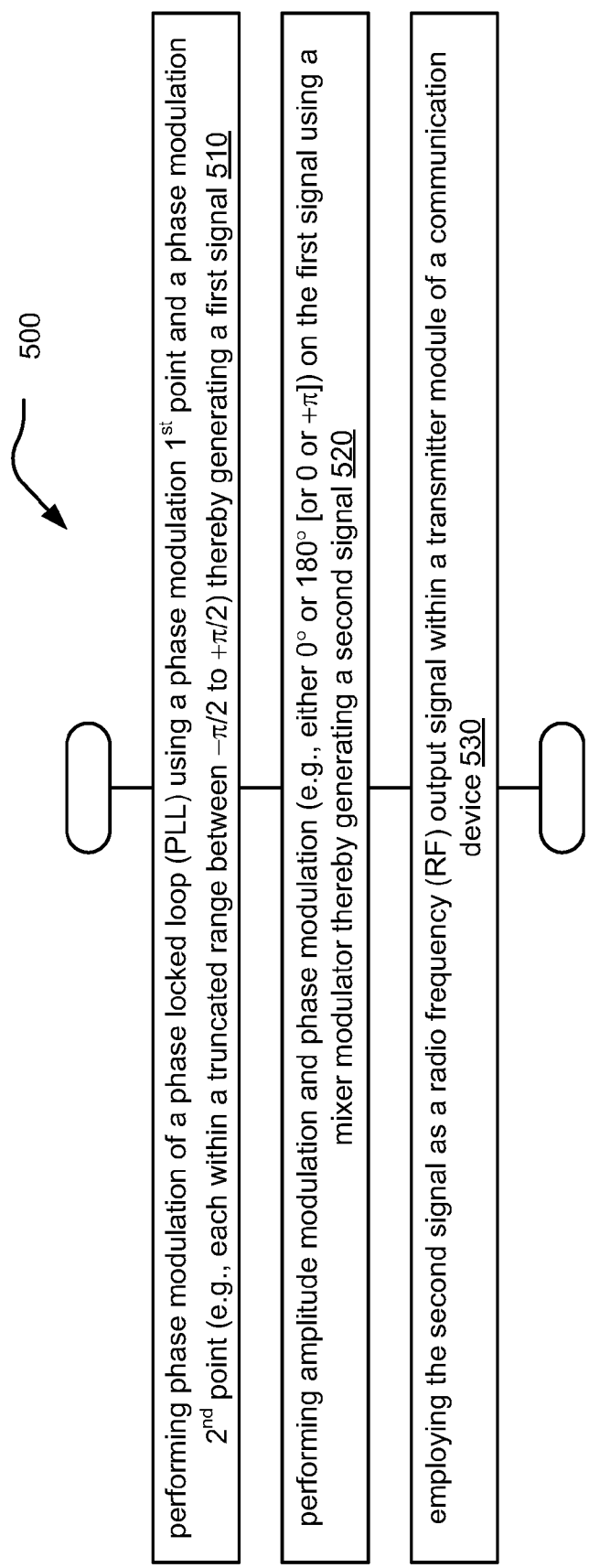

ENHANCED POLAR MODULATOR FOR TRANSMITTER

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility application Ser. No. 12/115,068, entitled "Enhanced polar modulator for transmitter,", filed May 5, 2008, pending, and scheduled to be issued as U.S. Pat. No. 7,750,750 on Jul. 6, 2010, which claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Application Ser. No. 61/042,599, entitled "Enhanced polar modulator for transmitter,", filed Apr. 4, 2008, now expired.

BACKGROUND OF THE INVENTION

1. Technical Field of the Invention

The invention relates generally to communication systems; and, more particularly, it relates to transmitter modules implemented within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera, communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

Within many such prior art communication devices, a polar modulator is employed in which a very large range of phases and/or angles are employed. These large modulation phases and/or angles can cause non-linearity in a voltage controlled oscillator (VCO) employed within a phase locked loop (PLL) that is part of such a prior art polar modulator. The very high signal range of these prior art modulation schemes can generally lead to distortion within the VCO of such a prior art apparatus. Such prior art approaches are generally not well suited for wideband communication systems. Moreover, a single balanced up-converted has an undesirable property that even order harmonics are not suppressed. As can be seen, there is a need within the art for a better means by which a transmitter module may be implemented within a communication device including a wireless communication device.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 5 is a diagram illustrating an embodiment of a method for operating a polar modulator as may be implemented within a wireless communication device.

DETAILED DESCRIPTION OF THE INVENTION

A novel architecture and means is presented herein that provides for an enhanced polar modulator such as may be implemented within a transmitter module within a communication device (e.g., including a wireless communication device). The polar modulator includes a phase locked loop (PLL) followed by a mixer/modulator. Within the PLL, a two point modulation topology is employed in which phase information passes through a limiter (e.g., a ±90° or ±π/2) in which the phase information dynamic range is divide by a factor (e.g., by 2) and a maximum frequency deviation is also divided by a factor (e.g., by 2).

Then, a double balanced up-converter mixer/modulator is implemented to perform gain adjustment (e.g., magnitude and/or amplitude adjustment) and phase changes of 0° and +180° (alternatively viewed as being −180°, which is the same as) +180°) or 0 and +π (alternatively viewed as being −π, which is the same as +π) (e.g., negative gains values may be employed). Phase adjustment in such an architecture is split and provided to both the PLL and to the mixer/modulator of such a polar modulator within a transmitter module such as may be implemented within a communication device (e.g., which may be a wireless communication device). This architecture that includes a PLL with a double balanced up-converter mixer/modulator suppresses even harmonics.

Figure 1:
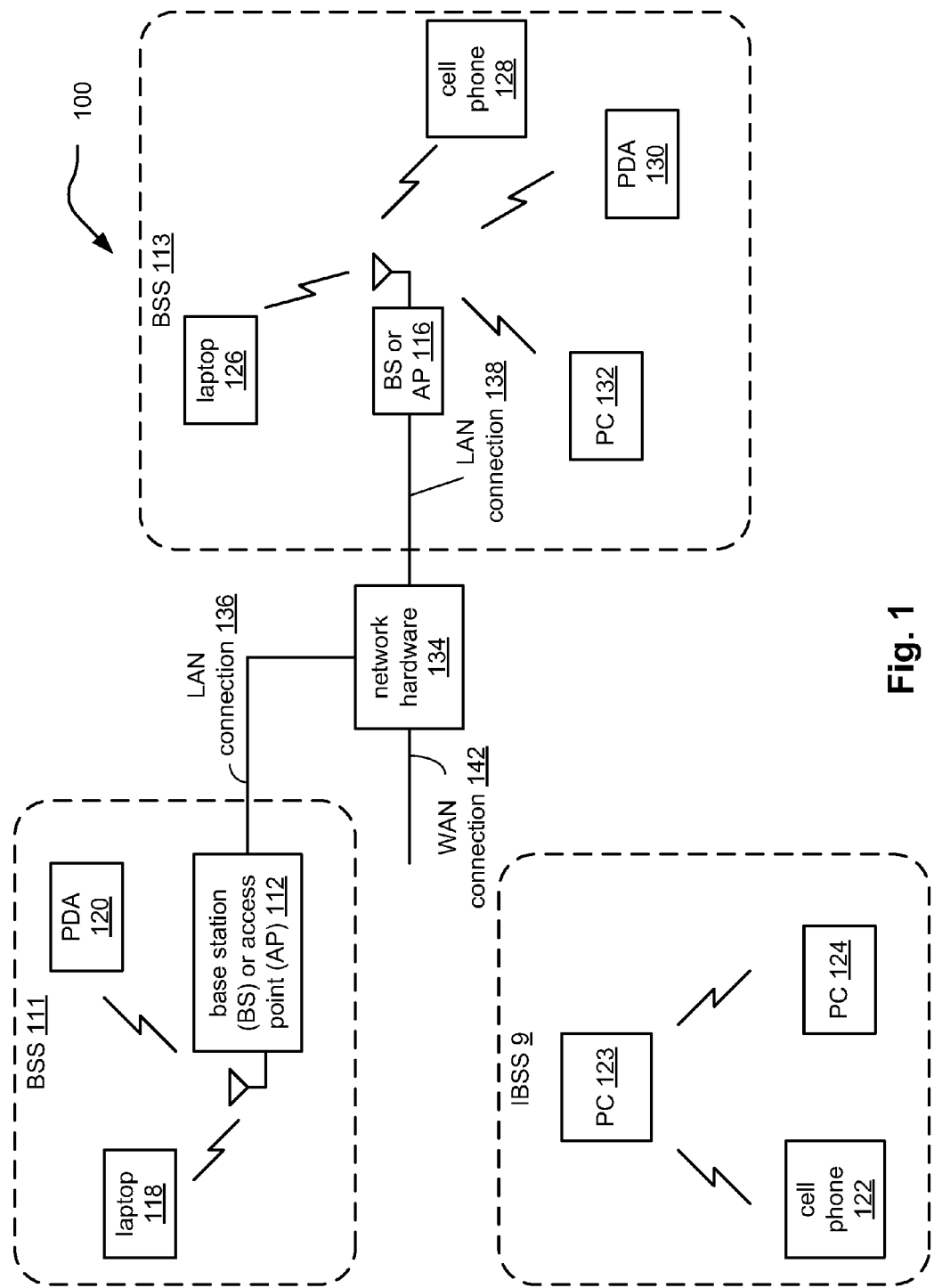
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera, provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
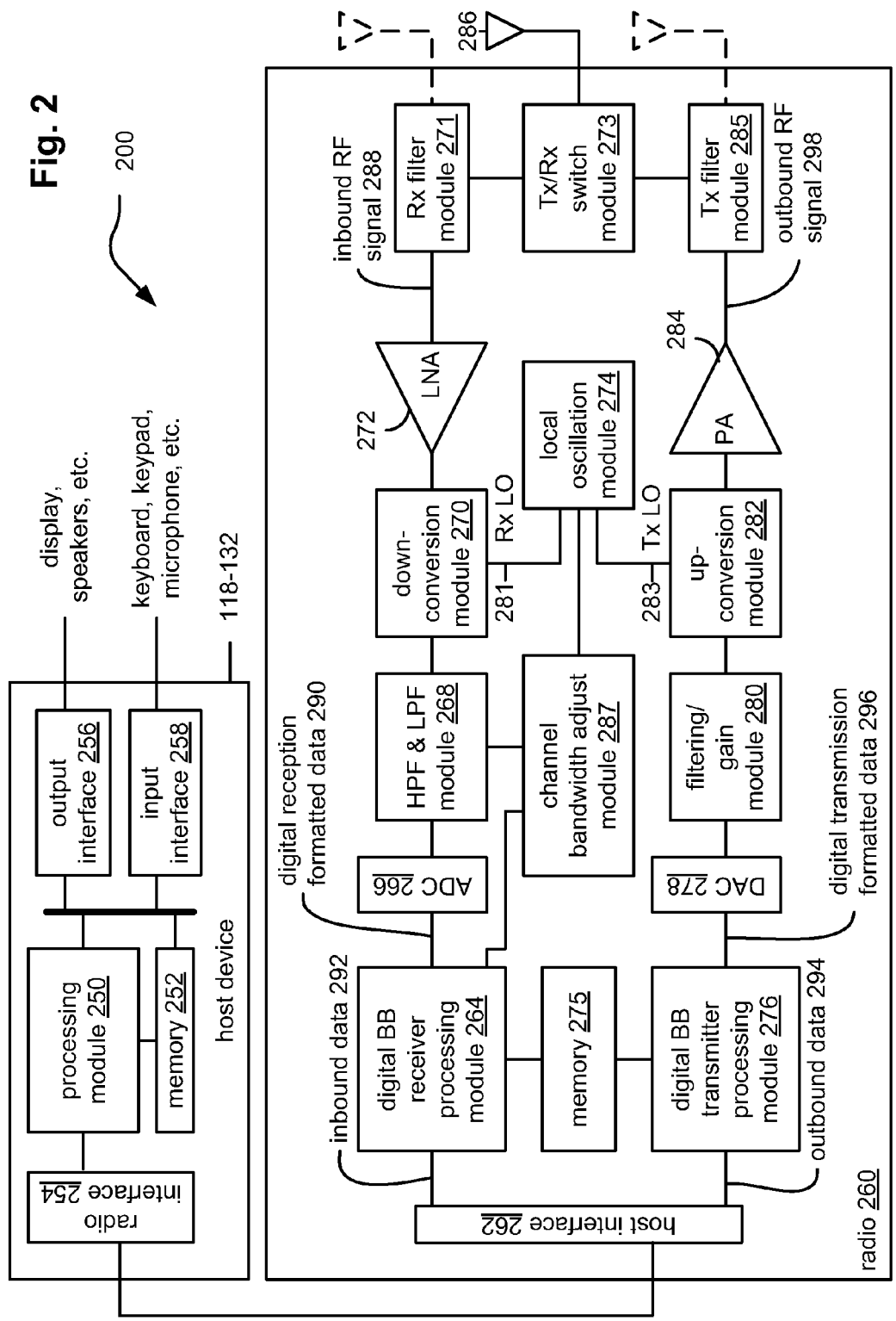
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera, via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
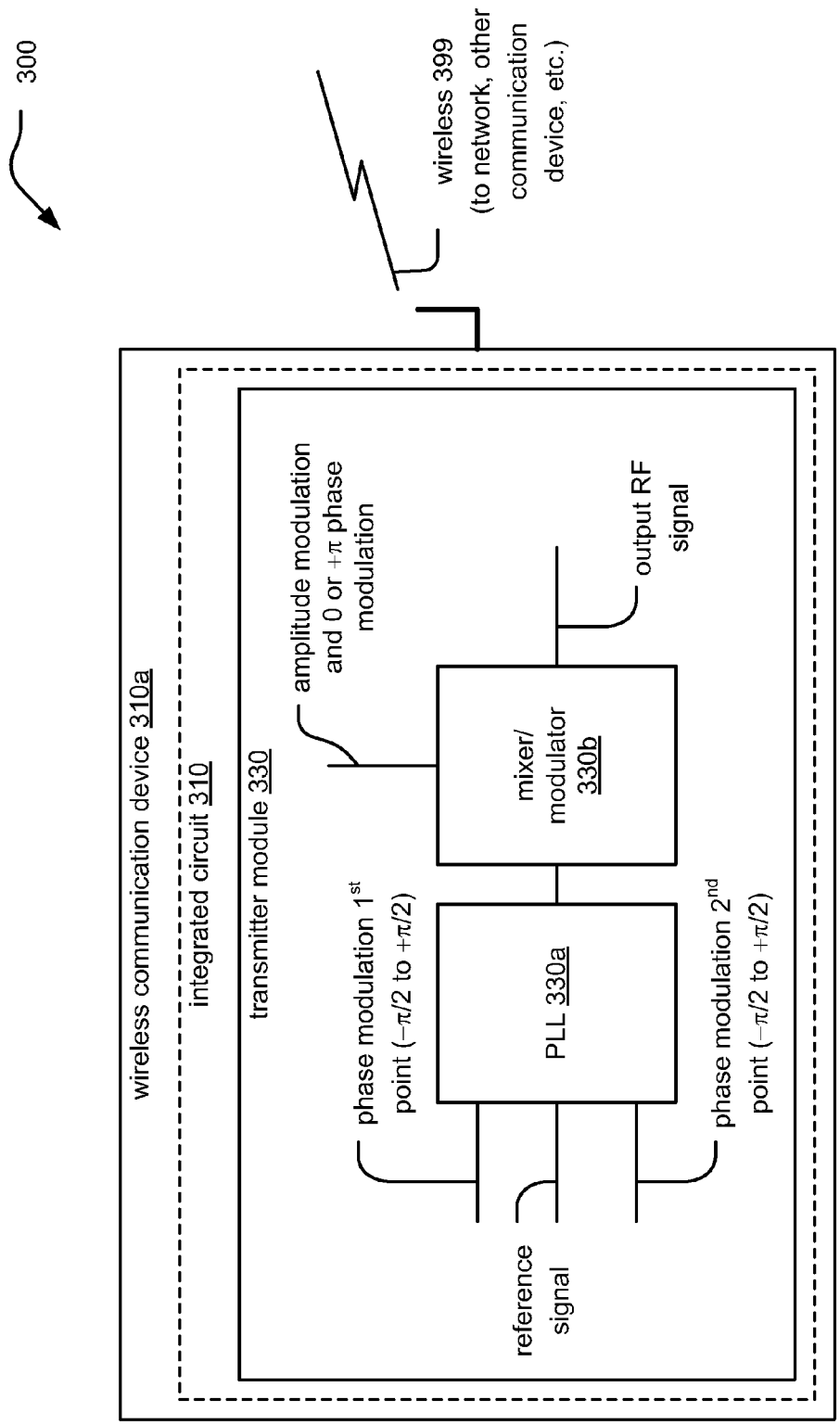
FIG. 3 is a diagram illustrating an alternative embodiment of a wireless communication system including a wireless communication device that includes dual point modulation capability and a balanced mixer/modulator.

FIG. 3 is a diagram illustrating an alternative embodiment of a wireless communication system 300 including a wireless communication device 310a that includes dual point modulation capability (e.g., within a phase locked loop (PLL) 330a) and a balanced mixer/modulator 330b.

The wireless communication device 310a can communicate via a wireless communication channel 399 to a communication network and/or one or more other communication devices. The PLL 330a and the mixer/modulator 330b may be implemented within an integrated circuit 310 (or alternatively within more than one integrated circuit) within the wireless communication device 310a.

A reference signal is provided to the PLL 330a and two separate limited modulation points are employed to perform a first stage of phase adjustment (e.g., phase modulation $1^{st}$ point (within truncated range between ±90° or ±π/2) and phase modulation $2^{nd}$ point (within truncated range between ±90° or ±π/2)). The signal generated by the PLL 330a is passed to a balanced mixer/modulator 330b that is capable to perform gain adjustment (e.g., magnitude and/or amplitude adjustment) and phase changes of 0° and +180° or 0 and +π (e.g., negative gains values may be employed). A radio frequency (RF) signal is then output from the mixer/modulator 330b.

Phase adjustment in such an architecture is split and provided to both the PLL 330a and to the mixer/modulator 330b of such a polar modulator within a transmitter module 330 such as may be implemented within the wireless communication device 310a. It is noted that the PLL 330a and the mixer/modulator 330b may be implemented within a single integrated circuit (e.g., integrated circuit 310) or using more than one integrated circuit.

Figure 4:
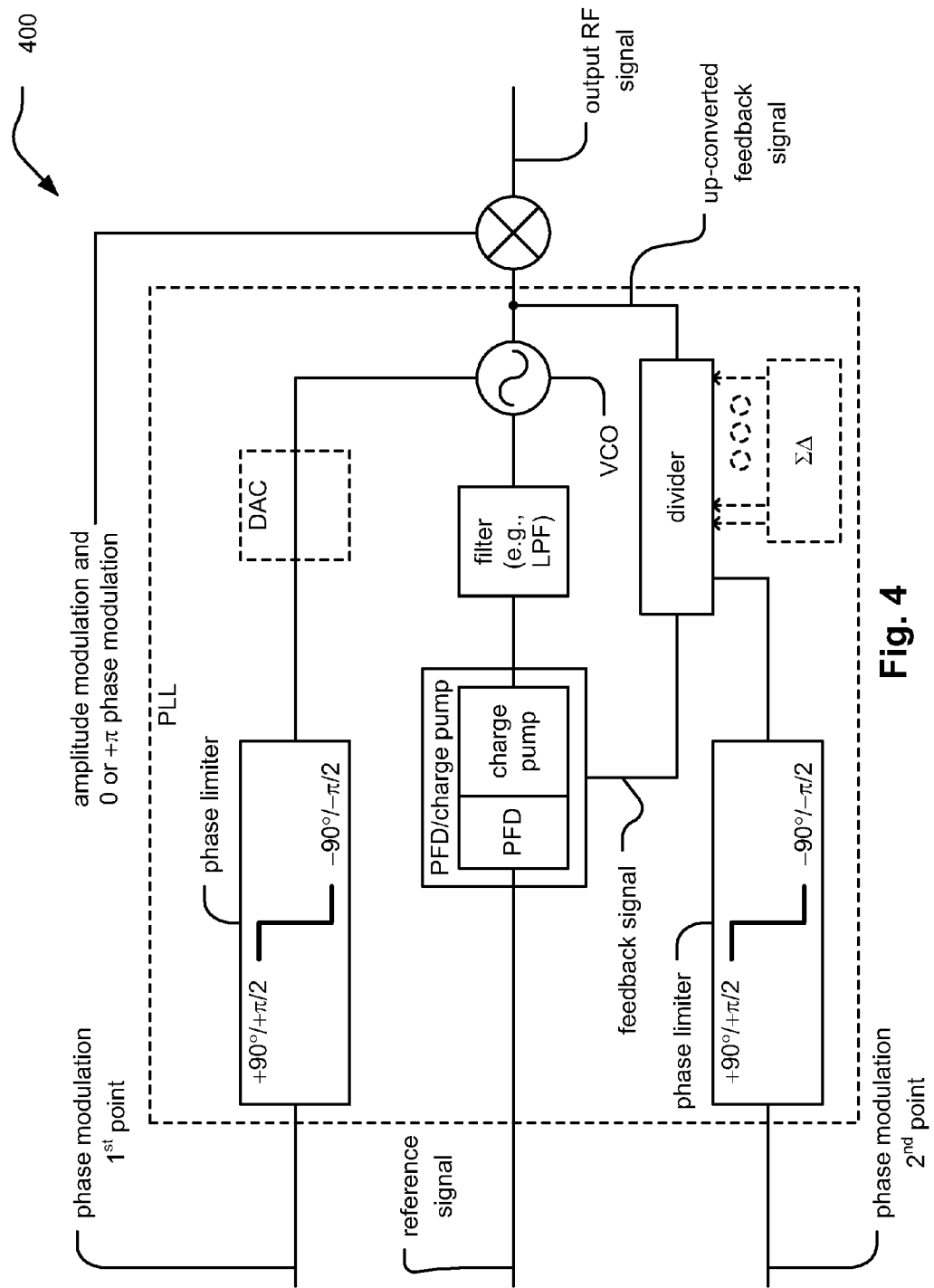
FIG. 4 is a diagram illustrating an embodiment of an apparatus that includes a phase locked loop (PLL) having by dual point modulation capability and a balanced mixer/modulator.

FIG. 4 is a diagram illustrating an embodiment of an apparatus 400 that includes a phase locked loop (PLL) having by dual point modulation capability and a balanced mixer/modulator.

The PLL 400 includes a PLL followed by a mixer/modulator. The PLL includes a phase frequency detector (PFD) that generates a charge pump control signal based on a phase difference between a reference signal and a feedback signal. The PLL also includes a charge pump that, based on the charge pump control signal, generates a voltage controlled oscillator (VCO) control signal. The PFD and the charge pump can be implemented within a single module if desired. The PLL also includes a filter (e.g., a low pass filter (LPF)), which is sometimes referred to as a loop filter, that filters the VCO control signal. The PLL also includes a VCO that generates an up-converted feedback signal based on the filtered VCO control signal and a first limited modulation point that is within a truncated range between ±90°. In embodiments in which the first limited modulation point is provided via a digital signal, a digital to analog converter (DAC) is employed to generate the control signal that is provided to the VCO of the PLL.

In the feedback path of the PLL, a divider that divides down the up-converted feedback signal, based on a second limited modulation point that is within the truncated range between ±90°, thereby generating the feedback signal. The divider can also be controlled by a sigma-delta (ΣΔ) module in certain embodiments. In even some embodiments, the second limited modulation point can be provided via the sigma-delta (ΣΔ) module.

The PLL is followed by a balanced up-converter mixer/modulator that processes the up-converted feedback signal thereby generating an output radio frequency (RF) signal having a selected magnitude.

It is noted that the VCO and the divider of the PLL operate cooperatively to set a phase of the feedback signal. The PLL and the balanced up-converter mixer/modulator operate cooperatively to set a phase of the output RF signal. As can be seen, the phase adjustment of the output RF signal is split and provided to both the PLL (e.g., via the phase modulation $1^{st}$ point and the phase modulation $2^{nd}$ point) and to the mixer/modulator of such an apparatus.

It is noted that the mixer/modulator is capable to perform gain adjustment (e.g., magnitude and/or amplitude adjustment) and phase changes of 0° and +180° and 0 and +π (e.g., negative gains values may be employed). A radio frequency (RF) signal is then output from the mixer/modulator.

There are a wide variety of communication system contexts in which the apparatus 400 of this embodiment, or any other embodiment depicted herein, may be implemented including those that operate in accordance with different protocols and/or bands. Some examples of various RATs include Global System for Mobile Communications (GSM), Enhanced Data Rates for GSM Evolution (EDGE), Code Division Multiple Access (CDMA), Wideband-Code Division Multiple Access (W-CDMA), UTRA-UTRAN Long Term Evolution (LTE) and 3GPP System Architecture Evolution (SAE), WiMAX (Worldwide Interoperability for Microwave Access), WiFi/WLAN (Wireless Local Area Network), ZigBee, Bluetooth, Ultra-Wide Band (UWB), and/or other types and variations thereof.

FIG. 5 is a diagram illustrating an embodiment of a method 500 for operating a polar modulator as may be implemented within a wireless communication device. The method 500 begins by performing phase modulation of a phase locked loop (PLL) using a phase modulation $1^{st}$ point and a phase modulation $2^{nd}$ point (e.g., each within a truncated range between ±π/2 or ±90°) thereby generating a first signal, as shown in a block 510.

The method 500 continues by performing amplitude modulation and phase modulation (e.g., changing the phase by either 0° or 180° [0 radians or +π radians]) on the first signal using a mixer modulator thereby generating a second signal, as shown in a block 520. The method 500 continues by employing the second signal as a radio frequency (RF) output signal within a transmitter module of a communication device, as shown in a block 530.

It is noted that the various modules (e.g., digital baseband processing modules, Tx or Rx modules, PLLs, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a processing module for generating a voltage controlled oscillator (VCO) control signal based on a phase difference between a reference signal and a first feedback signal;
a VCO for generating a second feedback signal based on the VCO control signal and a first limited modulation point being within a truncated range between ±90°; and
a divider for dividing the second feedback signal, based on a second limited modulation point being within the truncated range between ±90°, thereby generating the first feedback signal.

2. The apparatus of claim 1, the processing module further comprising:
a phase frequency detector (PFD) and for generating a charge pump control signal based on the phase difference between the reference signal and the first feedback signal; and
a charge pump for generating the VCO control signal based on the charge pump control signal.

3. The apparatus of claim 2, further comprising:
a balanced up-converter mixer/modulator for processing the second feedback signal thereby generating an output radio frequency (RF) signal having a selected magnitude; and wherein:
the apparatus including a phase locked loop (PLL) that includes the processing module, the VCO, and the divider;
the VCO and the divider operating cooperatively for setting a phase of the first feedback signal; and
the PLL and the balanced up-converter mixer/modulator operating cooperatively for setting a phase of the output RF signal.

4. The apparatus of claim 1, further comprising:
a balanced up-converter mixer/modulator for employing a negative gain to process the second feedback signal thereby generating an output radio frequency (RF) signal; and
a phase of the output RF signal being 180° different than a phase of the second feedback signal.

5. The apparatus of claim 1, further comprising:
a balanced up-converter mixer/modulator for processing the second feedback signal thereby generating an output radio frequency (RF) signal; and wherein:
the apparatus including a phase locked loop (PLL) that includes the processing module, the VCO, and the divider;
the PLL being a first stage for performing phase adjustment; and
the balanced up-converter mixer/modulator being a second stage for performing gain adjustment.

6. The apparatus of claim 1, further comprising:
a low pass filter (LPF), interposed between the processing module and the VCO, for reducing or eliminating high frequency content within the VCO control signal.

7. The apparatus of claim 1, wherein:
the apparatus being included within a transmitter module of an integrated circuit.

8. The apparatus of claim 1, further comprising:
a first phase limiter for processing a first modulation point thereby generating the first limited modulation point being within the truncated range between ±90°; and
a second phase limiter for processing a second modulation point thereby generating the second limited modulation point being within the truncated range between ±90°.

9. The apparatus of claim 1, further comprising:
a phase limiter for processing a first modulation point thereby generating the an intermediate, first modulation point, being digital in nature, being within the truncated range between ±90°; and
a digital to analog converter (DAC) for converting the intermediate, first modulation point to the first limited modulation point, being analog in nature.

10. The apparatus of claim 1, wherein:
the apparatus being a wireless communication device.

11. A phase locked loop (PLL), comprising:
a VCO for generating a feedback signal based on a VCO control signal and a first limited modulation point being within a truncated range between ±90°; and
a divider for dividing the feedback signal, based on a second limited modulation point being within the truncated range between ±90° thereby generating a divided feedback signal.

12. The PLL of claim 11, further comprising:
a phase frequency detector (PFD) and for generating a charge pump control signal based on a phase difference between a reference signal and the divided feedback signal; and
a charge pump for generating the VCO control signal based on the charge pump control signal.

13. The PLL of claim 12, wherein:
the PLL being coupled to a balanced up-converter mixer/modulator for processing the divided feedback signal thereby generating an output radio frequency (RF) signal having a selected magnitude;
the VCO and the divider operating cooperatively for setting a phase of the feedback signal; and
the PLL and the balanced up-converter mixer/modulator operating cooperatively for setting a phase of the output RF signal.

14. The PLL of claim 11, wherein:
the PLL being coupled to a balanced up-converter mixer/modulator for processing the divided feedback signal thereby generating an output radio frequency (RF) signal having a selected magnitude;
the PLL being a first stage for performing phase adjustment; and
the balanced up-converter mixer/modulator being a second stage for performing gain adjustment.

15. The PLL of claim 11, further comprising:
a first phase limiter for processing a first modulation point thereby generating the first limited modulation point being within the truncated range between ±90°; and
a second phase limiter for processing a second modulation point thereby generating the second limited modulation point being within the truncated range between ±90°.

16. The PLL of claim 11, further comprising:
a phase limiter for processing a first modulation point thereby generating the an intermediate, first modulation point, being digital in nature, being within the truncated range between ±90°; and
a digital to analog converter (DAC) for converting the intermediate, first modulation point to the first limited modulation point, being analog in nature.

17. A method, comprising:
generating a voltage controlled oscillator (VCO) control signal based on a phase difference between a reference signal and a first feedback signal;
employing a VCO for generating a second feedback signal based on the VCO control signal and a first limited modulation point being within a truncated range between ±90°; and
dividing the second feedback signal, based on a second limited modulation point being within the truncated range between ±90°, thereby generating the first feedback signal.

18. The method of claim 17, further comprising:
employing a phase frequency detector (PFD) and for generating a charge pump control signal based on the phase difference between the reference signal and the first feedback signal; and
employing a charge pump for generating the VCO control signal based on the charge pump control signal.

19. The method of claim 17, further comprising:
employing a first phase limiter for processing a first modulation point thereby generating the first limited modulation point being within the truncated range between ±90°; and
employing a second phase limiter for processing a second modulation point thereby generating the second limited modulation point being within the truncated range between ±90°.

20. The method of claim 17, further comprising:
employing a phase limiter for processing a first modulation point thereby generating the an intermediate, first modulation point, being digital in nature, being within the truncated range between ±90°; and
employing a digital to analog converter (DAC) for converting the intermediate, first modulation point to the first limited modulation point, being analog in nature.

* * * * *

UNITED STATES PATENT AND TRADEMARK OFFICE
CERTIFICATE OF CORRECTION

PATENT NO.        : 8,143,965 B2  
APPLICATION NO.   : 12/828838  
DATED             : March 27, 2012  
INVENTOR(S)       : Sofoklis Plevridis et al.

Page 1 of 1

It is certified that error appears in the above-identified patent and that said Letters Patent is hereby corrected as shown below:

Col. 10, line 17, in claim 2:  after "(PFD)" delete "and"  
Col. 11, line 3, in claim 9:   after "generating" delete "the"  
Col. 11, line 21, in claim 12: after "(PFD)" delete "and"  
Col. 12, line 6, in claim 16:  after "generating" delete "the"  
Col. 12, line 25, in claim 18: after "(PFD)" delete "and"  
Col. 12, line 42, in claim 20: after "generating" delete "the"

Signed and Sealed this  
Twenty-eighth Day of August, 2012

David J. Kappos  
*Director of the United States Patent and Trademark Office*